United States Patent [19]

Umemura

[11] Patent Number: 4,713,258

[45] Date of Patent: Dec. 15, 1987

[54] METHOD OF FORMING ULTRAFINE PATTERNS

[75] Inventor: Shizuo Umemura, Ibaraki, Japan

[73] Assignee: Research Development Corporation of Japan, Tokyo, Japan; a part interest

[21] Appl. No.: 752,208

[22] Filed: Jul. 3, 1985

[30] Foreign Application Priority Data

Aug. 6, 1984 [JP] Japan .............................. 59-163881

[51] Int. Cl.$^4$ ............................................... B05D 3/06
[52] U.S. Cl. ...................................... 427/35; 427/43.1
[58] Field of Search ...................... 427/35, 43.1, 54.1; 430/16, 414, 942

[56] References Cited

U.S. PATENT DOCUMENTS

| | | | |
|---|---|---|---|
| 2,883,257 | 4/1959 | Wehe | 346/74 |
| 3,333,984 | 8/1967 | Kaspaul et al. | 427/39 |
| 3,378,401 | 4/1968 | Kaspaul | 430/435 |
| 3,392,051 | 7/1968 | Caswell et al. | 427/44 |
| 3,547,631 | 12/1970 | Weglein | 430/742 |
| 3,671,238 | 6/1972 | Kaspaul | 430/16 |
| 3,736,142 | 5/1973 | Kaspaul | 430/541 |
| 3,790,380 | 2/1974 | McKee et al. | 430/5 |
| 4,197,332 | 4/1980 | Broers et al. | 430/742 |
| 4,316,073 | 2/1982 | Broers et al. | 427/43.1 |
| 4,357,364 | 11/1982 | Jones | 427/43.1 |

Primary Examiner—John H. Newsome
Attorney, Agent, or Firm—Flynn, Thiel, Boutell & Tanis

[57] ABSTRACT

A method of forming an ultrafine pattern, said method comprising selectively forming adsorption sites on a substrate surface by irradiation with a focused electron beam in a vacuum and then depositing a pattern-forming substance onto the substrate by vacuum vapor deposition, chemical vapor deposition, sputtering or other suitable deposition methods, thereby forming the aimed ultrafine patterns. The method can provide ultrafine patterns in a very high resolution or precision by means of an electron beam irradiation and deposition technique under carefully controlled process conditions and, particularly, the electron beam irradiation in the presence of oil gas results in a better quality of pattern.

12 Claims, No Drawings

METHOD OF FORMING ULTRAFINE PATTERNS

BACKGROUND OF THE INVENTION

The present invention relates to a method of forming ultrafine patterns and, more particularly, to an ultrafine processing technique capable of providing ultrafine patterns of desired substances on substrates in a high precision, using a combination of electron beam irradiation and deposition techniques.

Conventional ultrafine processing techniques have been practiced by exposing an electron beam resist to a focused electron beam and etching it by several methods. However, according to the conventional techniques, it is impossible to provide patterns finer than 0.1 μm due to the limited resolution of the resist. Therefore, they can not fully meet the requirements for high resolution or precision, and in the art there is a great demand for finer processing techniques capable of forming patterns having a much higher resolution in comparison with heretofore available patterns. Accordingly the present invention was developed in response to this.

SUMMARY OF THE INVENTION

An object of the present invention is to provide a method of forming ultrafine patterns which can provide finer and more precise patterns than those made by the prior art set forth above, in a high precision.

Many studies and attempts have been made in order to achieve the objects of the invention and, as a result, the inventor arrived at the present invention. That is, the above object of the invention can be attained by selectively forming preferred sites for the deposition of a pattern-forming substance (i.e., adsorption sites) on a substrate by irradiating a focused electron beam onto the substrate in a vacuum and then depositing the pattern-forming substance onto the substrate by vacuum vapor deposition, chemical vapor deposition, sputtering or other suitable deposition methods.

According to the method of the invention, patterns of high resolution corresponding to the diameter of the used focused electron beam can be successfully provided and, thus, very fine lines with a high resolution level of 50 Å can be produced even in the currently used electron beam techniques.

DETAILED DESCRIPTION OF THE PREFERRED EMBODIMENTS

The present invention is characterized in the method of forming ultrafine patterns onto a substrate which comprises selectively forming adsorption sites on the surface of a substrate by irradiation with a focused electron beam in a vacuum and then depositing a pattern-forming substance onto the substrate by vacuum vapor deposition, chemical vapor deposition, sputtering or other known methods, thereby forming the aimed ultrafine patterns in a high precision.

The following process conditions may be included as preferred embodiments of the method of the invention set forth above:
  The deposition is performed onto the substrate being heated at a temperature higher than 50° C.
  After the deposition, the substrate is heated to a temperature higher than 50° C.
  The irradiation with an electron beam is performed in an evacuated atmosphere containing gas or vapor, preferably vapor of oil used in an oil diffusion pump.
  The substrate is made of metal or semiconductor.

Hereinafter, the present invention will be explained in detail along the processing line.

In the first step of the present invention, adsorption sites are selectively formed on the surface of a substrate by an irradiation with a focused electron beam in an evacuated atmosphere. In this method, it is preferable that the diameter of the focused electron beam be adjusted within 1000 Å, since the diameter plays a dominant role in the pattern resolution or precision.

As one method of forming of adsorption sites, lattice defects can be formed onto a substrate as adsorption sites by using an electron beam with a higher energy than 1 Mev. However, more preferably, the electron beam irradiation is performed in an evacuated atmosphere containing vapor or gas and thereby adsorbates or deposits are formed from the vapor or gas on the surface of a substrate. Therefore, the vapor or gas contained in the evacuated atmosphere is required to form adsorbates or deposits thereof or of decomposition product thereof or deposits of reaction products with the substrate, on the surface of the substrate surface by the electron beam irradiation. As preferable examples for practical applications, vapors of oils employed an oil diffusion pump, which have been commonly used to maintain a highly evacuated condition, can be used and the vapors can meet the above-mentioned requirement.

The decomposition products can be deposited on the substrate by irradiating an electron beam to the surface of the substrate in a vacuum containing vapor or gas of, for example, $SiH_4$, $GeH_4$, $SnH_4$, $CH_4$, $PbH_4$, $(CH_3)_3Al$, $(CH_3)_2As$, $(CH_3)_4Pb$, $(CH_3)_3Ga$, etc. Further, the reaction products can be formed on the substrate by irradiating an electron beam to the surface of the substrate in a vacuum containing vapor or gas of, for example, Si, Ge, Sn, $O_2$ or $NH_3$. When fine patterns to be formed are required to be free from contamination, vapor or gas capable of forming deposits or precipitates which do not cause any contamination problem must be used. As examples of such vapor or gas, silane gas such as $SiH_4$; organometallic vapor, such as $(CH_3)_3Al$, $(CH_3)_2As$, $(CH_3)_4Pb$ or $(CH_3)_3Ga$; or hydride gas, such as $GeH_4$, $SnH_4$ or $PbH_4$, can be preferably employed and these gases or vapors easily decompose to form deposits on the surface of the substrate. The degree of vacuum is preferably controlled within $1 \times 10^{-3}$ Torr and the partial pressure of the gas or vapor used for the formation of the adsoption sites is preferably within $1 \times 10^{-4}$ Torr.

As a further method for forming selectively adsorption sites on the surface of a substrate, the following method can be employed. A substance capable of forming adsorption sites is in advance adsorbed onto the entire surface of the substrate and, thereafter, a focused electron beam is irradiated onto the desired areas of the surface of the substrate, thereby forming selectively adsorption sites onto the substrate. In this method, since the electron beam irradiation can be carried out in an atmosphere not containing vapor or gas, it is not necessary to use any special vapor or gas in the atmosphere for the electron beam irradiation.

In the first step set forth above, adsorption sites are formed onto the surface of the substrate. When the irradiation quantity of electron beam is insufficient, the aimed effect can not be fully attained, whereas an excess irradiation will form large-sized adsorption sites wider than the diameter of the used electron beam and unfavorably lower the precision of the resulting patterns.

In the second step of the invention, pattern-forming substances are deposited onto the surface of the substrate subjected to the first step by vacuum vapor deposition, chemical vapor deosition, sputtering or other suitable deposition methods, and, in this step, heating or cooling is required depending on a combination of the used substrate and the substance to be deposited.

The method of the invention can be completed by this deposition step by appropriately selecting a combination of a substrate material and a substance to be deposited and the temperature of the substrate. However, in general, after the deposition process, the substrates are required to be heated to a temperature higher than 50° C. and the heating temperature is changed depending on a combination of a substrate material and a deposited substance.

In the invention, any substrate can be employed as long as its surface is sufficiently smooth. Of course, the substrate must withstand required heat treatments. The substrate materials used in the present invention can be, for example, metals such as Be, Mg, Ti, Zr, V, Nb, Ta, Cr, Mo, W, C, Mn, Fe, Co, Ir, Ni, Pd, Pt, Cu, Ag, Au, Zn, Al, Ga, In, Sn, Pb or alloys thereof; semiconductors such as Si or Ge; semiconducting compounds such as GaAs, GaP or ZnS; oxides such as BeO, CaO, $Fe_2O_3$, MgO, NiO, $SiO_2$, ZnO, $ZrO_2$, $Al_2O_3$, $Cr_2O_3$, $TiO_2$ or CoO; nitrides such as TiN, $Zr_3N_2$, AlN, CrN, $Si_3N_4$, ZrN, $Mg_3N_2$, FeN or BN; alkali halides such as NaCl, NaI, KCl, KI or KBr; or organic compounds such as polyethylene terephtalate, polyimid, polyamid, polyvinyl chloride, cellulose triacetate, polycarbonate or polyethylene naphthalate.

The substrate material can be either crystalline or amorphous and further a thin film thereof deposited onto a different substrate can be also used as a substrate.

In practice, however, conductive substrates are more preferable for the formation of much finer patterns, since they minimize an influence of charging due to the irradiation of electron beam.

Although there is no specific limitation with respect to substances to be deposited (namely pattern-forming substances) used in the present invention, the following substances can be given as examples: Namely, metals such as Be, Ti, Zr, V, Nb, Ta, Sm, Gd, Dy, Tb, Cr, Mo, W, Mn, Fe, Co, Ni, Pd, Pt, Cu, Ag, Au, Zn, Al, Gd, In, Sn, Pb or alloys thereof; semiconductors such as Si or Ge; semiconducting compounds such as GaAs, GaP or ZnS; oxides such as $Fe_2O_3$, NiO, $SiO_2$, SiO, $Al_2O_3$, $CrO_2$, $Cr_2O_3$ or CoO; alkali halides such as NaCl, NaI, KCl, KI or KBr; or organic compounds such as lauric acid, myristic acid, palmitic acid, stearic acid, acrylic acid, propiolic acid, methacrylic acid, metallophthalocyanine, merocyanine, naphthalene, anthracene, pyrene, polyethylene, fluorine-containing polymer, polyimid, polyacrylonitrile or polycarbonate. Among these substances, particularly substances with a lower melting point are more advantageously employed, since patterns can be readily formed.

Preferably, it is desirable to change the deposition amount of the substances depending upon the degree of resolution required in the resulting pattern. More specifically, the deposition amounts are reduced as patterns become finer.

Usually, when patterns of 1000 Å or finer are required, the deposition amount is preferably from 20 to 100 Å in terms of the thickness of the deposited layer.

The mechanism or process of the pattern formation according to the invention can be considered as follows.

Deposits, adsorbates and other modified products formed on the surfaces of substrates in the first step act as stable adsorption sites for pattern-forming substances to be deposited in the second step. In the second step, atoms or molecules adsorbed onto the adsorption sites can not easily migrate, but atoms or molecules adsorbed onto the other portions readily migrate toward the adsorption sites on the surface of the substrate. Therefore, if during deposition process the substrate is heated at a sufficiently high temperature to allow the atoms or molecules adsorbed to the portions other than the adsorption sites to migrate, the adsorbed substances can crystal-grow on the stable adsorption sites as nuclei and patterns are formed on the adsorption sites formed in the first step.

However, even if the substrate is not heated sufficiently during deposition process, similar patterns can be obtained by heating after the deposition process. Based on our detailed examination, the heating temperature is higher than 50° C. and it is more preferable to heat the substrate after deposition process rather than during this process.

Now, the method of the invention will be described in more detail the following Examples.

In the Examples, electron beam irradiation was performed with an electron scanning microscope type VL-130 manufactured by AKASHI SEISAKUSHO, LTD. In order to evacuate, a vacuum system containing a combination of an oil rotary pump and an oil diffusion pump was employed except in Example 6 and Comparative Example 1, and electron beam irradiation was performed in a vacuum atmosphere containing the vapor of oils used in the oil diffusion pump except the foregoing two examples. Depositions of pattern-forming substances were all performed by vacuum vapor deposition.

EXAMPLE 1

An area of 5 μm×5 μm of a silicon wafer substrate was irradiated with an electron beam with a diameter of approximetely 50 Å scanned in a striped pattern with a spacing of 150 Å between scanning lines, for five minutes, under an accelerating voltage of 30 kV and an applied current of 10 μμA. When the electron beam was transferred to a different scanning line, the irradiation was interrupted by blanking the beam.

Subsequently, gold was vacuum deposited in a thickness of 40 Å onto the irradiated silicon wafer substrate at a substrate temperature of 30° C. and then the substrate was heated to 200° C.

The areas irradiated with the electron beam were examined with an electron microscope and a striped pattern composed of gold lines 100 Å in width spaced 150 Å apart from each other was observed.

EXAMPLE 2

Another pattern was prepared in the same procedures as described in Example 1 with the exception that the electron beam was scanned with a spacing of 300 Å between scanning lines and the deposition thickness of deposited gold was 50 Å. The observation with an electron microscope revealed a striped pattern composed of gold lines approximately 200 Å wide spaced 300 Å apart from adjacent lines.

EXAMPLE 3

An area of 5 μm×5 μm of a silicon wafer substrate was irradiated with an electron beam, approximately 50 Å in diameter, scanned in a striped pattern with a spacing of 150 Å between scanning lines, for three minutes, under an accelerating voltage of 30 kV and an applied current of 10 μμA. When the electron beam was transferred to a different scanning line, the irradiation was interrupted by blanking the beam.

Thereafter, the irradiated area of the substrate was subjected to a further irradiation under the same conditions as specified above except that the scanning direction was vertical to that of the previous irradiation.

After the above two-stage irradiation, silver was deposited in a thickness of 40 Å onto the silicon wafer substrate while maintaining the substrate temperature at 30° C. and then the substrate was heated to 200° C.

The irradiated area of the wafer was examined with an electron microscope and it was observed that ultrafine silver particles with a diameter of about 100 Å were arranged in a two-dimensional square lattice pattern having a spacing of 150 Å between the lines.

EXAMPLE 4

Electron beam irradiation was performed on an area of 5 μm×5 μm of a 100 Å thick carbon layer, which was deposited onto the cleaved surface of a sodium chloride single crystal, with an electron beam with a diameter of approximately 50 Å scanned in a striped pattern with a spacing of 150 Å between scanning lines, for five minutes, under an accelerating voltage of 30 kV and an applied current of 10 μμA. When the electron beam was transferred to a different scanning line, the irradiation was interrupted by blanking the beam.

Thereafter, a gold film with a thickness of 40 Å was deposited onto the substrate, the temperature of the substrate being maintained at 250° C.

The observation with an electron microscope revealed a striped pattern composed of approximately 100 Å wide gold lines spaced 150 Å apart from adjacent lines.

EXAMPLE 5

Electron beam irradiation was conducted on an area of 5 μm×5 μm of a cleaved surface of $MoS_2$ single crystal with an electron beam with a diameter of 50 Å scanned in a striped pattern with a spacing of 300 Å, for five minutes, under an accelerating voltage of 30 kV and a current of 10 μμA. When the beam was transferred to a different scanning line, the irradiation was interrupted by blanking the beam.

Subsequently, a 30 Å thick silver deposit was provided to the substrate by vacuum vapor deposition and the irradiated portion of the substrate was examined with an electron microscope. As a result of the examination, a striped pattern consisting of silver lines with about 100 Å in width spaced 300 Å from each other was observed.

EXAMPLE 6

After a silicon wafer was left for one hour in an atmosphere containing silcone vapor and adjusted at a pressure of $10^{-4}$ Torr, electron beam irradiation was performed with the electron scanning microscope free from an oil vapor under the same conditions as described in Example 1, except using a turbo molecular pump in place of the vacuum pumps in Example 1.

Thereafter, a 40 Å thick gold deposit was formed onto the surface of the substrate at a substrate temperature of 30° C. and then the substrate was heated to a temperature of 200° C.

The irradiated area of the silicon wafer was examined with an electron microscope and a striped pattern composed of gold lines with a width of approximately 100Å spaced 150 Å apart from adjacent lines was observed.

COMPARATIVE EXAMPLE 1

A comparative experiment was performed in the same procedures as described in Example 1 except that a turbo molecular pump was employed in place of the vacuum pumps in Example 1 in order to conduct the pattern forming process in the absence of oil vapor. The area which was subjected to the electron beam irradiation was examined with an electron microscope and no gold pattern could be detected.

As previously described, the present invention provides ultrafine patterns of substances deposited onto substrates in a high precision and makes possible ultrafine processing which can not be achieved by any prior art. Therefore, the method of the invention is very useful in various applications such as graphoepitaxy, the manufacture of mask for very large scale integrated circuit (VLSI), high frequency device using Josephson junction, high density recording system, gas sensor or catalyst.

What is claimed is:

1. A method of forming an ultrafine pattern on a substrate, which consists essentially of the steps of: holding a substrate in a highly evacuated system that employs an oil diffusion pump as a vacuum source, the atmosphere in said highly evacuated system comprising a vapor of the operating oil of the oil diffusion pump; then projecting a focused electron beam in a pattern against a surface of said substrate and thereby forming a pattern of adsorption sites comprised of adsorbates or deposits of said vapor of said operating oil on the irradiated area on said surface of said substrate; and then depositing a pattern-forming substance onto said substrate so that said substance adheres to said adsorption sites and forms a pattern having a width of 1000 Å or finer.

2. The method as claimed in claim 1 in which said pattern-forming substance is deposited onto said substrate after said substrate has been heated to a temperature higher than 50° C.

3. The method as claimed in claim 1 in which said substrate is heated to a temperature higher than 50° C. after said pattern-forming substance has been deposited thereon.

4. The method as claimed in claim 1 in which said substrate is made of metal or a semiconductor.

5. A method as claimed in claim 1 in which the thickness of said pattern-forming substance on said substrate is from 20 to 100 Å.

6. A method as claimed in claim 1 in which said surface of said substrate consists of a metal, a semiconductor element, a semiconductor compound, a metal oxide, a metal nitride or an alkali halide.

7. A method of forming an ultrafine pattern on a substrate, which consists essentially of the steps of: placing a substrate in a system that contains a vapor of the operating oil of an oil diffusion pump so that molecules of said operating oil are adsorbed on the entire surface of said substrate; highly evacuating said system; then projecting a focused electron beam in a pattern against said surface of said substrate and thereby selectively forming a pattern of adsorption sites comprised of adsorbates of said vapor of said operating oil on the irradiated area on said surface of said substrate; and then depositing a pattern-forming substance onto said substrate so that said substance adheres to said adsorption sites and forms a pattern having a width of 1000 Å or finer.

8. A method as claimed in claim 7 in which the thickness of said pattern-forming substance on said substrate is form 20 to 100 Å.

9. A method as claimed in claim 7 in which said surface of said substrate consists of a metal, a semiconductor element, a semiconductor compound, a metal oxide, a metal nitride or an alkali halide.

10. The method as claimed in claim 7 in which said pattern-forming substance is deposited onto said substrate after said substrate has been heated to a temperature higher than 50° C.

11. The method as claimed in claim 7 in which said substrate is heated to a temperature higher than 50° C. after said pattern-forming substance has been deposited thereon.

12. The method as claimed in claim 7 in which said substrate is made of metal or a semiconductor.

* * * * *